United States Patent

Nenadic et al.

[11] Patent Number: 5,871,313
[45] Date of Patent: Feb. 16, 1999

[54] PRECISE SELF-ALIGNING CHAMFER METHOD AND APPARATUS

[75] Inventors: Anton Nenadic, Red Hook; David Scott Graboski, Wappingers Falls; William A. Cavaliere, Verbank; James Edward Tersigni, Castleton, all of N.Y.

[73] Assignee: International Business Machines Corporation, Armonk, N.Y.

[21] Appl. No.: 815,022

[22] Filed: Mar. 14, 1997

Related U.S. Application Data

[63] Continuation-in-part of Ser. No. 725,664, Oct. 1, 1996, abandoned.

[51] Int. Cl.[6] .................................................. B23C 9/00
[52] U.S. Cl. ........................ 409/138; 409/178; 409/184; 409/203; 83/869
[58] Field of Search ................................ 409/138, 178, 409/184, 203; 83/869, 914, 929.1

[56] References Cited

U.S. PATENT DOCUMENTS

| | | | |
|---|---|---|---|
| 4,018,134 | 4/1977 | Linsinger | 409/138 |
| 4,364,696 | 12/1982 | Syarto et al. | 409/138 |
| 4,472,333 | 9/1984 | Ohtani | 264/67 |
| 4,504,178 | 3/1985 | Seidenfaden | 409/138 |
| 4,608,783 | 9/1986 | Bavelloni | 409/138 |
| 4,653,362 | 3/1987 | Gerber | 83/16 |
| 4,768,309 | 9/1988 | Miller | 51/128 |
| 4,881,857 | 11/1989 | Tanaka et al. | 409/138 |
| 4,952,159 | 8/1990 | Fukuda et al. | 409/138 |
| 4,976,573 | 12/1990 | Seki et al. | 409/138 |
| 4,993,896 | 2/1991 | Dombrowski et al. | 409/138 |
| 4,997,323 | 3/1991 | Giandalia et al. | 409/138 |
| 5,009,038 | 4/1991 | Yoshikawa et al. | 51/126 |
| 5,018,914 | 5/1991 | Kishi | 409/178 |
| 5,028,179 | 7/1991 | Grasset | 409/138 |
| 5,044,843 | 9/1991 | Velepee | 409/138 |
| 5,095,360 | 3/1992 | Kizaki et al. | 357/74 |
| 5,160,747 | 11/1992 | Kizaki et al. | 425/352 |
| 5,423,642 | 6/1995 | Heck | 409/138 |

*Primary Examiner*—Maurina T. Rachuba
*Attorney, Agent, or Firm*—Steven J. Soucar

[57] ABSTRACT

A cutting assembly and an apparatus for self-aligned chamfering of a workpiece are disclosed. The chamfering apparatus includes a mechanism for releasably securing the workpiece in preparation for a chamfering thereof, a cutting assembly, and a mechanism for moving the cutting assembly proximate the securing mechanism between a first position and a second position, wherein the cutting assembly traverses along an edge portion of the workpiece to be chamfered. The cutting assembly includes (i) a guide member having a guide surface; (ii) a blade member mechanically coupled with respect to the guide surface for establishing a desired cutting depth; (iii) a mechanism for applying a resilient tensioning force to the guide member, the resilient tensioning means applying a first tensioning force when the guide member is in a non-chamfer engaging position and applying a second tensioning force when the guide member is in a chamfer engaging position, the chamfer engaging position corresponding to a position of the guide member when the guide surface engages the portion of the workpiece to be chamfered; and (iv) a mechanism for locking the guide member to maintain the chamfer engaging position and the desired cutting depth subsequent to the guide surface no longer being in contact with the workpiece. A method of chamfering is also disclosed.

25 Claims, 10 Drawing Sheets

PRECISE SELF-ALIGNING CHAMFER METHOD AND APPARATUS

CROSS-REFERENCE

This is a continuation-in-part application of U.S. patent application Ser. No. 08/725,664 filed on Oct. 1, 1996, now abandoned.

BACKGROUND OF THE INVENTION

1. Field of the Invention

The present invention relates to a method and apparatus for chamfering side edges and corners of an electronic package, and more particularly, to a method and apparatus for providing a precise self-aligned chamfer on side edges and corners of the electronic package.

2. Discussion of the Related Art

Controlled Collapsed Chip Connector (C4) ball grid array (BGA) multilayer ceramic (MLC) packages are quickly becoming a staple in the electronics packaging industry. The C4 BGA package offers several advantages over its predecessor, the wire bond pin grid array (PGA) package. Most important of the advantages of the C4 BGA package is its ability to pack more input/output (I/O) into a smaller area. The C4 BGA substrates are normally under 32 mm in size and on the order of 5–7 layers thick (approximately 1.0 mm thick). In comparison, a typical wirebond PGA package would be on the order of 44 or 50 mm in size and about 10 layers thick, thicker than the C4 BGA package.

Figure 1:
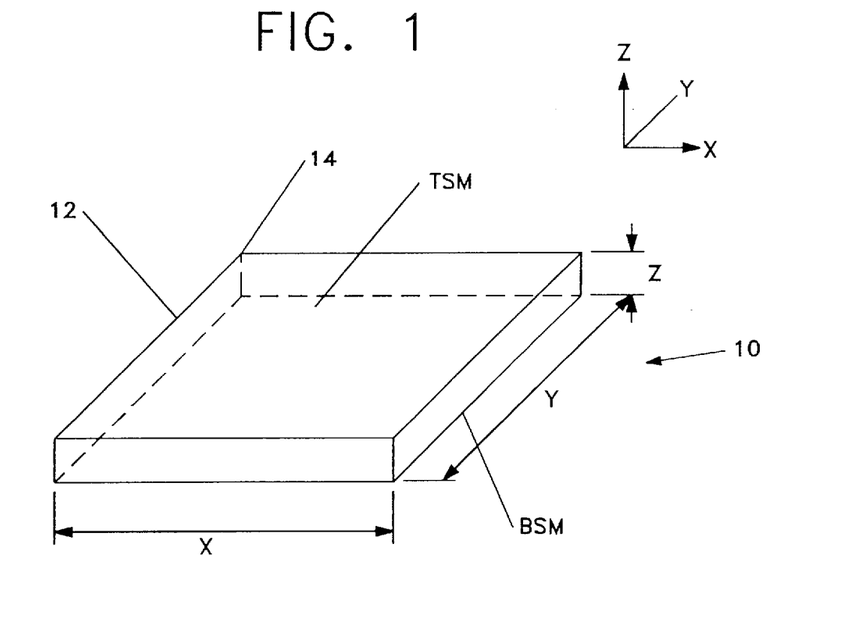
FIG. 1 illustrates a plan view of an unchamfered substrate.
Figure 2:
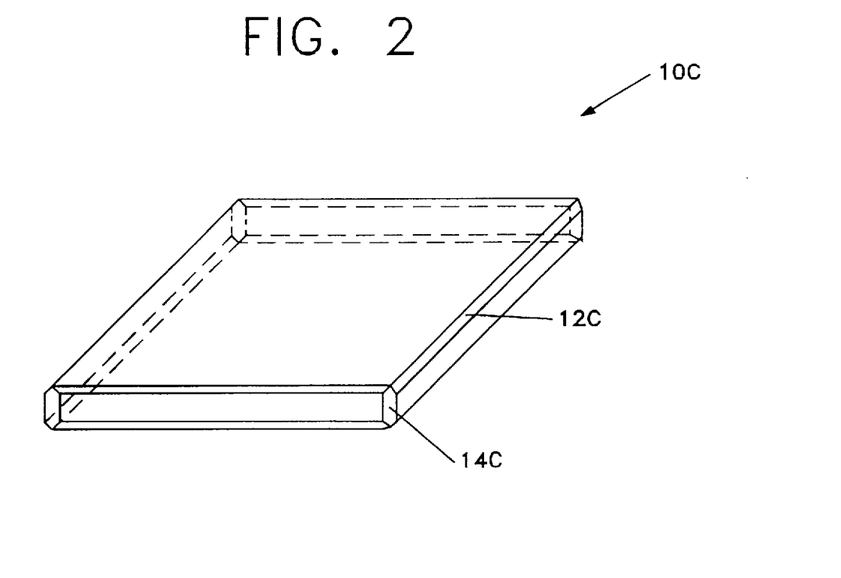
FIG. 2 illustrates a plan view of a chamfered substrate.

The smaller size of the ceramic chip carrier presents several problems. One such problem is not having an ability to chamfer both the edges 12 and the corners 14 (FIG. 1) of a ceramic substrate 10 in a reliable and repeatable manner with low loss yields. Corner and edge chamfers are required for both aesthetic reasons as well as for yield purposes. For instance, a sharp ceramic edge is very brittle and vulnerable to chipping and cracking. During semiconductor chip device packaging processes, plating and bond & assembly processes typically fixture off (i.e., reference from) the substrate sides. As a result of fixturing off of the substrate sides, there are usually high yield losses associated with non-chamfered edges. The problem is further complicated by tighter spacings between the substrate side and the active metallurgy of the package which results in less room for the chamfer. A normal BGA chamfer is on the order of 0.004"–0.008" on a side edge and on the order of 0.012"–0.020" at the corners, as compared to 0.006"–0.028" on the side edge and 0.012"–0.025" at the corners for a PGA product. A top surface of the substrate may contain top surface metallurgy (TSM) and/or the bottom surface of the substrate may contain bottom surface metallurgy (BSM) which the chamfer must avoid. FIG. 2 illustrates a substrate 10C having corner and edge chamfers, 14C and 12C, respectively.

The chamfer tools presently used to chamfer PGA product are not suitable for BGA chamfering since the chamfer size which results from use of those tools will vary with the tolerance on the X-Y size and thickness (i.e., as a result of fixed cutter positions). Furthermore, the parts to be chamfered are typically moved, flipped and rotated several times in order to achieve 8 edge chamfers and 4 corner chamfers using such known chamfer tools. Increased handling of a substrate can be a cause for major yield problems in the chamfering of much thinner packages, also.

Finally, since the most cost effective method of producing chamfered substrates is to chamfer the parts in a "green" or unfired state, there is an exposure to the problem of delamination. Delamination is the undesired separating of the layers of the ceramic substrate. The ceramic substrate, in its unfired state, is actually a composite of many layers of ceramic compressed together, wherein the layers tend to separate or delaminate when contacted by a cutting tool.

A chamfering apparatus which overcomes the above problems would be highly desirable in the industry.

SUMMARY OF THE INVENTION

It is an object of the present invention to provide a chamfering apparatus for producing reproducible side edge and corner chamfers on a substrate (also referred to herein as a workpiece), particularly, an unfired ceramic substrate.

It is a further object of the present invention to provide a method of chamfering which allows precisely prepared chamfered edges to be predictably obtained.

It is a further object of the present invention to produce precisely prepared chamfered edges on substrates which are rectangular while using the same tool as used for the more usual square substrates.

According to the present invention, an apparatus for self-aligned chamfering of a workpiece includes a means for releasably securing the workpiece in preparation for a chamfering thereof, a cutting assembly, and a means for moving the cutting assembly proximate the securing means between a first position and a second position, wherein the cutting assembly traverses along an edge portion of the workpiece to be chamfered as the cutting assembly is moved from the first position to the second position. The cutting assembly includes (i) a guide member having a guide surface; (ii) a blade member, the blade member mechanically coupled with respect to the guide surface for establishing a desired cutting depth; (iii) means for applying a resilient tensioning force to the guide member, the resilient tensioning means applying a first tensioning force when the guide member is in a non-chamfer engaging position and applying a second tensioning force when the guide member is in a chamfer engaging position, the chamfer engaging position corresponding to a position of the guide member when the guide surface engages the portion of the workpiece to be chamfered; and (iv) means for locking the guide member to maintain the chamfer engaging position and the desired cutting depth subsequent to the guide surface no longer being in contact with the workpiece.

In accordance with another embodiment according to the present invention, a cutter apparatus, for use in self-aligned chamfering of a workpiece as the cutter apparatus is traversed along a portion of the workpiece to be chamfered, includes a guide member having a guide surface. A blade member is mechanically coupled with respect to the guide surface for establishing a desired cutting depth. A resilient tensioning means is provided for applying a resilient tensioning force to the guide member, the resilient tensioning means applying a first tensioning force when the guide member is in a non-chamfer engaging position and applying a second tensioning force when the guide member is in a chamfer engaging position. The chamfer engaging position corresponds to a position of the guide member when the guide surface engages the portion of the workpiece to be chamfered. In addition, a locking means locks the guide member to maintain the chamfer engaging position and the desired cutting depth subsequent to the guide surface no longer being in contact with the workpiece.

Still further, in accordance with the present invention, a method for self-aligned chamfering of a workpiece includes the steps of releasably securing the workpiece in preparation for a chamfering thereof. A cutting assembly is provided, wherein the cutting assembly includes (i) a guide member having a guide surface; (ii) a blade member, the blade member mechanically coupled with respect to the guide surface for establishing a desired cutting depth; (iii) means for applying a resilient tensioning force to the guide member, the resilient tensioning means applying a first tensioning force when the guide member is in a non-chamfer engaging position and applying a second tensioning force when the guide member is in a chamfer engaging position, the chamfer engaging position corresponding to a position of the guide member when the guide surface engages the portion of the workpiece to be chamfered; and (iv) means for locking the guide member to maintain the chamfer engaging position and the desired cutting depth subsequent to the guide surface no longer being in contact with the workpiece. Lastly, chamfering includes the step of moving the cutting assembly proximate the secured workpiece between a chamfer start position and a chamfer end position, wherein the cutting assembly traverses along an edge portion of the workpiece to be chamfered as the cutting assembly is moved from the chamfer start position to the chamfer end position.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 3:
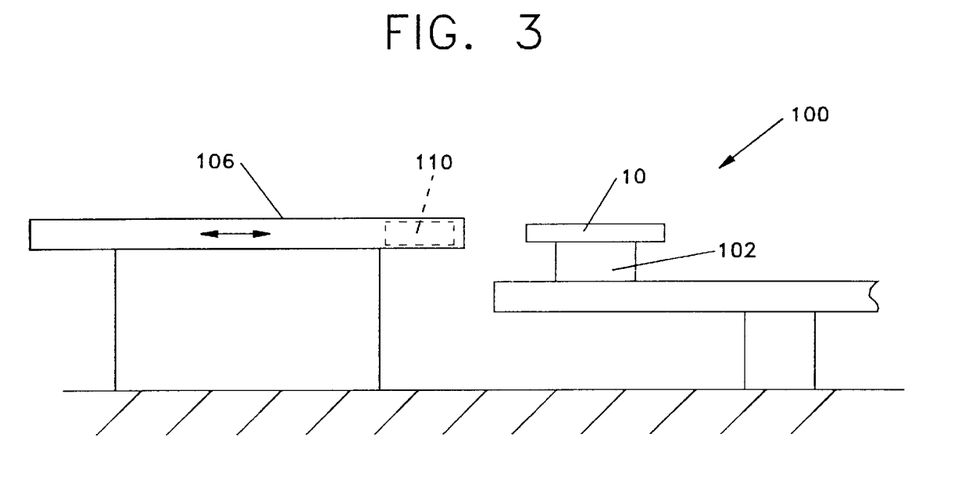
FIG. 3 shows a side perspective view of one embodiment of a self-aligned chamfering apparatus in accordance with the present invention, shown in a retracted position.
Figure 4:
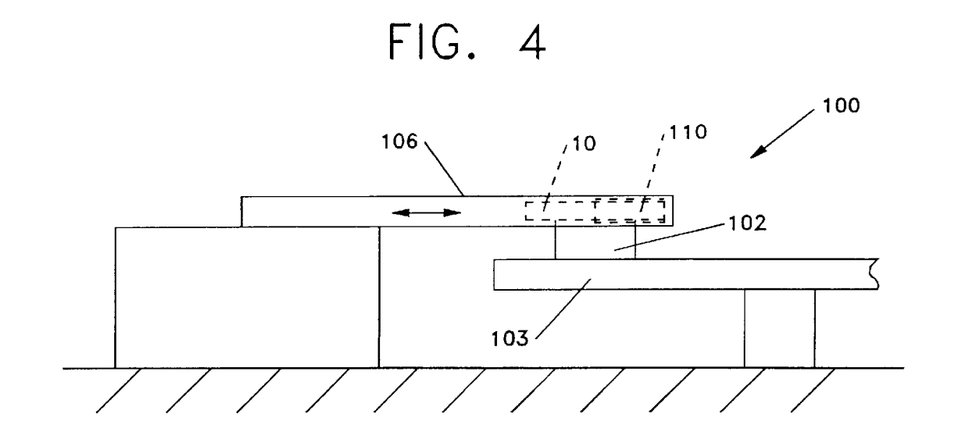
FIG. 4 shows a side perspective view of the self-aligned chamfering apparatus of FIG. 3 in a chamfer position.

Referring now to FIGS. 3 and 4, a self-aligned chamfer apparatus 100 of the present invention for chamfering of a substrate 10 (also referred to herein as a workpiece) (e.g., a ceramic package) includes a means 102 for securing the substrate in a prescribed position in preparation for a chamfering operation. Securing means 102 may include, for example, a pedestal or other suitable means for securing the substrate in the desired position. A cutting assembly 110 is coupled to a moving means 106 for moving the cutting assembly 110 of chamfer apparatus 100 between a chamfer start position (FIG. 4) and a chamfer end position (FIG. 3), to be discussed further herein below.

Figure 5:
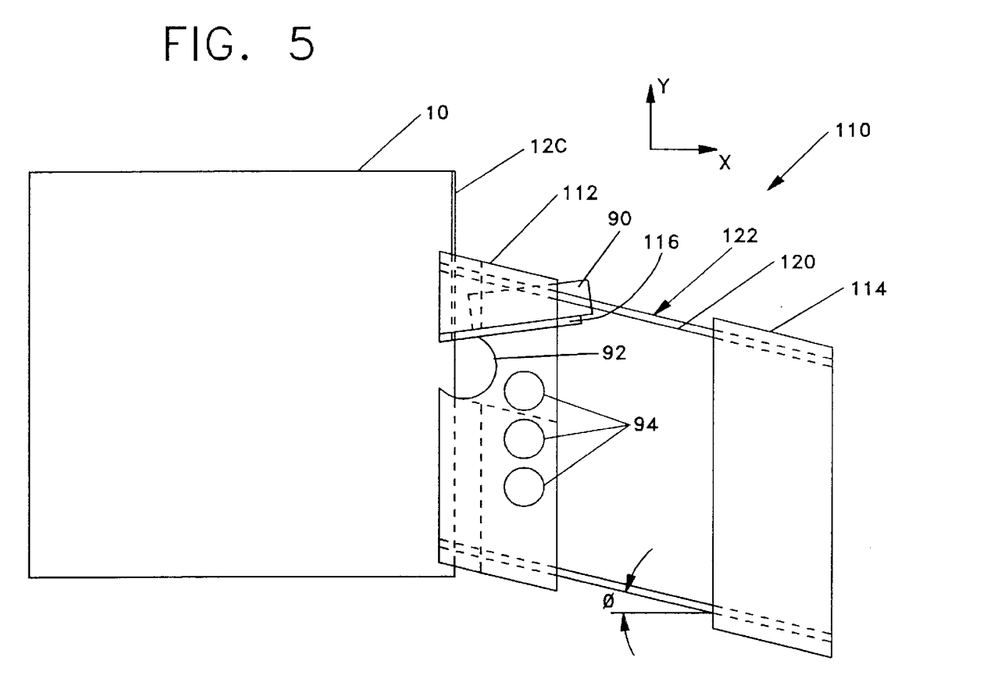
FIG. 5 shows a top view of one embodiment of a cutting assembly of the self-aligned chamfering apparatus of the present invention.
Figure 6:
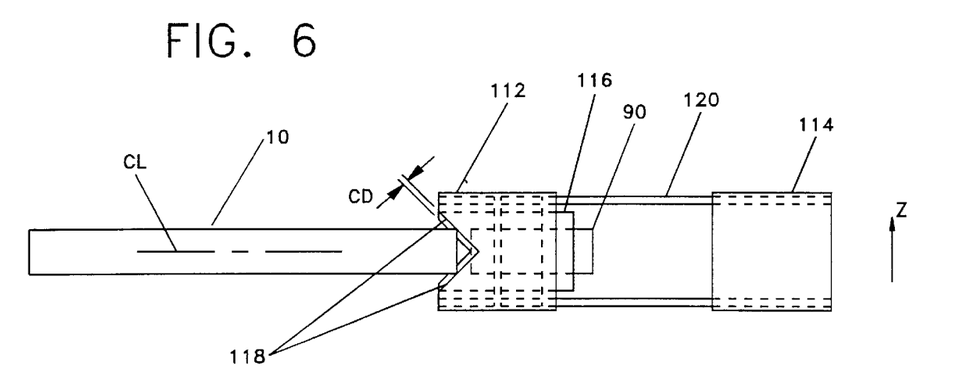
FIG. 6 shows a side view of the cutting assembly of the self-aligned chamfering apparatus of FIG. 5.

Turning now to FIGS. 5 and 6, cutting assembly or cutter apparatus 110 is shown in greater detail for use in self-aligned chamfering of the workpiece 10 as the cutter apparatus 110 is traversed along a portion (e.g., an edge or corner) of the workpiece 10 to be chamfered. Cutter apparatus 110 includes a guide member 112 having a guide surface 118 (see FIG. 6). Guide member 112 is preferably comprised of aluminum (for its machinability and for weight considerations) or other suitable material. A blade member 116 is mechanically coupled with respect to the guide surface 118 for establishing a desired cutting depth (CD). Blade 116 is attached to guide member 112 in a prescribed manner at a fixed distance CD from alignment surface 118 so that a chamfer cut remains at a uniform, repeatable depth. In accordance with the present invention, the self aligning cutter assembly 110 (FIGS. 5 and 6) is suitable for use as an automated chamfer tool or as a manual chamfer tool.

Figure 7:
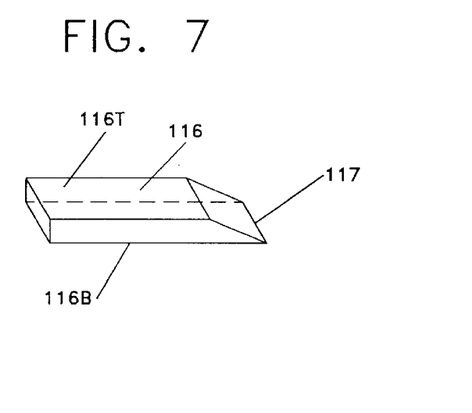
FIG. 7 illustrates an example of a blade member used in conjunction with the present invention.
Figure 8:
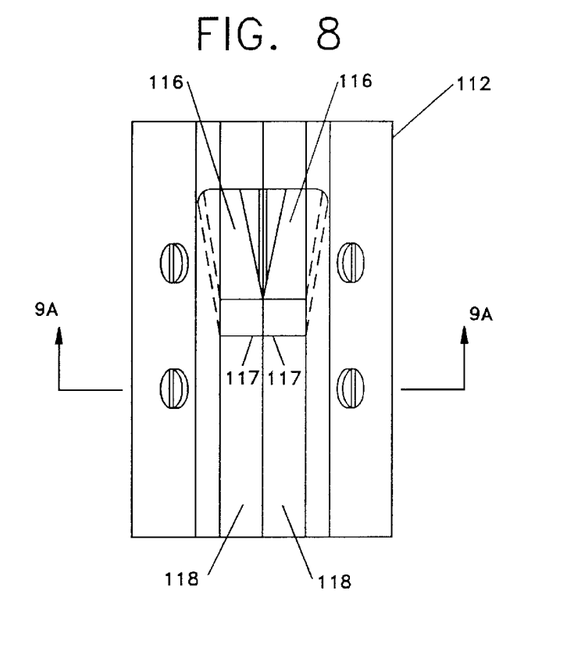
FIG. 8 illustrates a view of the guide surfaces and blades of a guide member for use in the apparatus according to the present invention.
Figure 9:
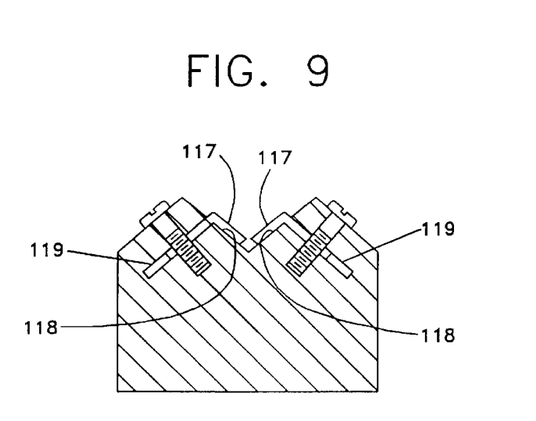
FIG. 9 is a sectional view of the guide member of FIG. 8 taken along line 9A—9A having guide surfaces that form a V-shape.

In a preferred embodiment, cutting assembly 110 has two blades 116 (FIGS. 6, 8 and 9). The cutter assembly 110 having two blades 116 can advantageously cut both a top and bottom chamfer in a single pass. That is, in the preferred embodiment, guide member 112 includes a V-shaped guide surface 118 for slidable engagement along two parallel side edges of the workpiece 10 to be chamfered (FIG. 6). In the instance wherein guide member 112 includes a V-shaped guide surface, blade member 116 includes blade edges for matching the V-shaped guide surface 118, each blade edge providing an edge chamfer along a respective side edge of the workpiece 10. Blade member 116 includes any suitable blade member having a top surface 116T and a bottom surface 116B as shown, for example, in FIG. 7. The blades 116 are preferably made from carbide and have a polycrystaline diamond cutting edge 117. The blades 116 are further preferably mounted in a fixed position with respect to the aligning surface 118 of the guide 112 to ensure that the proper depth of cut (i.e., chamfer depth CD) is made. FIGS. 8 and 9 are exemplary of a top view and a cross-sectional view (along line 9A—9A of FIG. 8), respectively, of a portion of the guide member 112, showing one manner for placement of the blades 116 within the guide member. For instance, appropriate recesses or grooves are suitably machined into areas of guide surfaces 118 of guide member 112 for receiving individual blades 116. Suitable slots are also provided as clamp reliefs, wherein each blade is secured in place in a recess using screws or other suitable fasteners.

Figure 10:
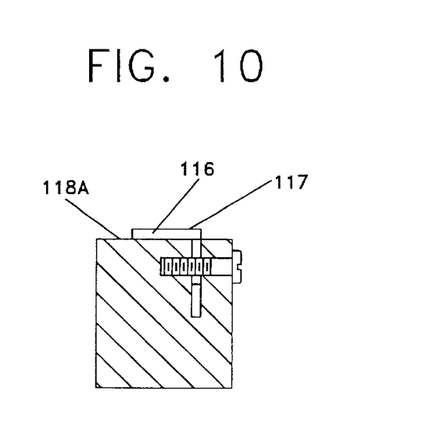
FIG. 10 is a sectional view of an alternate guide member having a flat guide surface.

In an alternate embodiment, guide member 112 includes a flat guide surface 118A for slidable engagement along a portion of the workpiece to be chamfered (FIG. 10). In the instance wherein guide member 112 includes a flat guide surface, blade member 116 includes a blade edge for matching the flat guide surface 118A, wherein the blade edge is preferably used for providing a corner chamfer along a corner of the workpiece.

Referring once again to FIGS. 5 and 6, a heater element 90 can be provided and suitably attached to guide member 112 in the proximity of blades 116. Such a heater element 90 may include a cartridge heater, such as, a firerod heater, commercially available from Watlow of St. Louis, Mo. Heat can thus be applied to the cutter assembly 110 for enhancing the cutting action as may be desirable in a particular chamfering operation. In addition heat can be applied to minimize a delamination problem often associated with "green" chamfering methods. Another benefit of applying heat is that the heat facilitates creation of larger shavings which are more readily removed away from the substrate during a chamfering operation. Creation of larger shavings reduces the chances of particulate debris or fused ceramic when the chamfered substrate is subsequently sintered.

Guide member 112 further includes a chip relief aperture 92 proximate cutting blades 116, as shown in FIG. 5. Chip relief aperture 92 facilitates removal of shavings away from the substrate during a chamfering operation. A vacuum (not shown) is applied at one side of the guide member 112 to draw the shavings away through aperture 92. Still further, guide member 112 is provided with cooling apertures 94 to facilitate a cooling of guide member 112, on an area of guide member 112 distal from the blades 116, during a chamfering operation.

Guide member 112, used for an alignment purpose, is resiliently attached to a fixed base 114 via resilient rods 120. As a result, the guide 112 is permitted to automatically adjust itself to the substrate edges 12 regardless of size (i.e., in X-Y dimension) or thickness variation (i.e., in a Z dimension, as will be discussed below with respect to guide 112 having a V-shaped groove).

Alignment in the Z-direction is accomplished by attaching the cutter assembly 110 to the fixed base 114 with two sets of two (i.e., four total) parallel rods 120 (FIG. 6). The rods 120 allow the cutter guide 112 and blade 116 to travel in the Z-direction while maintaining a parallel relationship with the fixed base 114 and also the workpiece (i.e., substrate 10). The alignment surfaces 118 of the guide 112 form a V-shaped grove and contact the substrate 10 along the length of the top and bottom edges 12. The V-shaped grove will advantageously center the cutter blades 116 with respect to a center line of the substrate 10 regardless of the thickness of the part (i.e., substrate 10).

A similar methodology is used to align the cutter blades 116 and guide 112 to the substrate 10 in the X-direction. The two sets of two (four total) parallel rods 120 (FIG. 5) are used to connect the cutter blades 116 and guide 112 to the fixed base 114 and to maintain a parallel relationship between the guide 112 and the base 114. As the guide 12, and more particularly the guide surfaces 118, contacts the edge 112 of the substrate 10, flexure will occur in the rods 120 and produce a resilient spring force which ensures that physical contact is made and obtained regardless of an X-Y size of the substrate 10. The angle φ of the rods 120 (FIG. 5) and thus the amount of flexure determine an amount of force which is exerted on the edge 12 of the substrate 10. The amount of force is controlled in an appropriate manner so as not to damage the substrate 10. The combination of the X and Z alignment advantageously results in a precisely aligned blade 116 with respect to an edge 12 (or edges as the case may be) of the substrate 10 and allows the cutter assembly 110 to achieve a chamfer cut that remains at a uniform, repeatable depth CD.

A resilient tensioning means 122 is thus provided for applying a resilient tensioning force to the guide member 112. The resilient tensioning means 122 applies a first tensioning force when the guide member 112 is in a non-chamfer engaging position. That is, the first tensioning force corresponds to a force applied to the guide member 112 when the guide member is in a relaxed position or free state. In other words, the guide member is not in contact with the workpiece to be chamfered. The resilient tensioning means 122 applies a second tensioning force greater than the first tensioning force when the guide member is in a chamfer engaging position. The chamfer engaging position corresponds to a position of the guide member 112 when the guide surface 118 engages the portion of the workpiece 10 to be chamfered.

Figure 16:
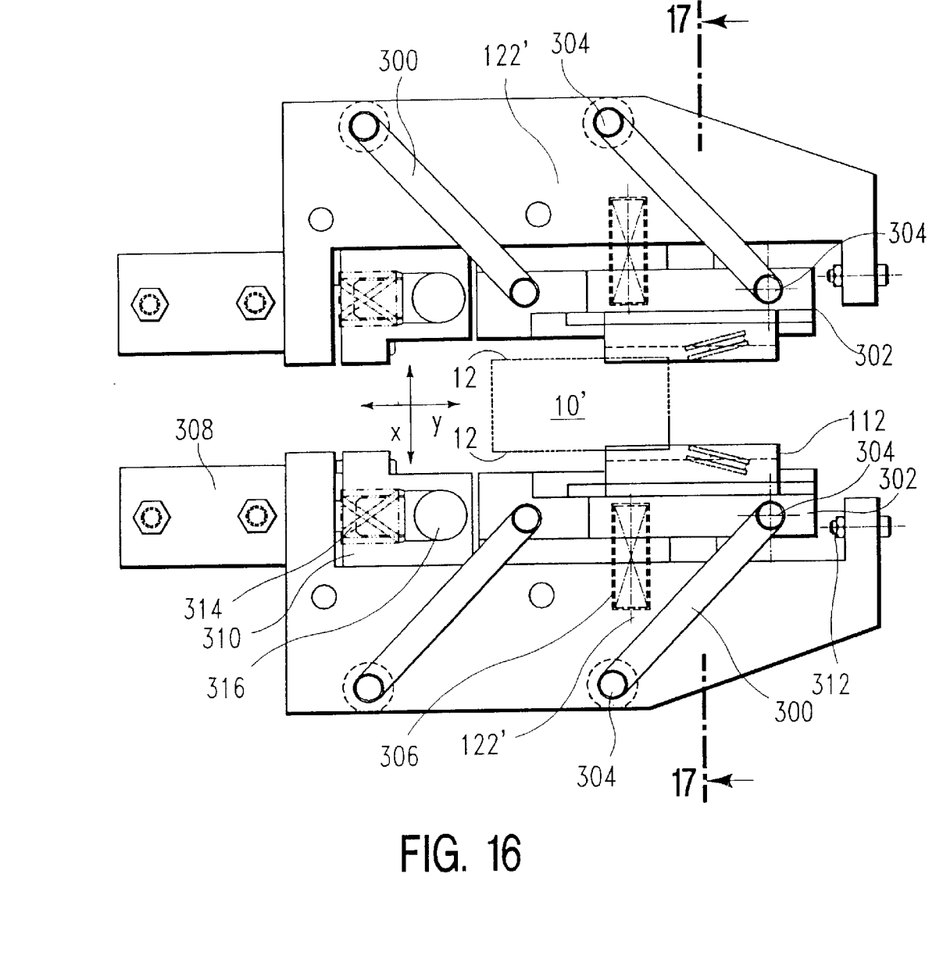
FIG. 16 illustrates a top view of a preferred embodiment of the self-aligned chamfering apparatus of the present invention.
Figure 17:
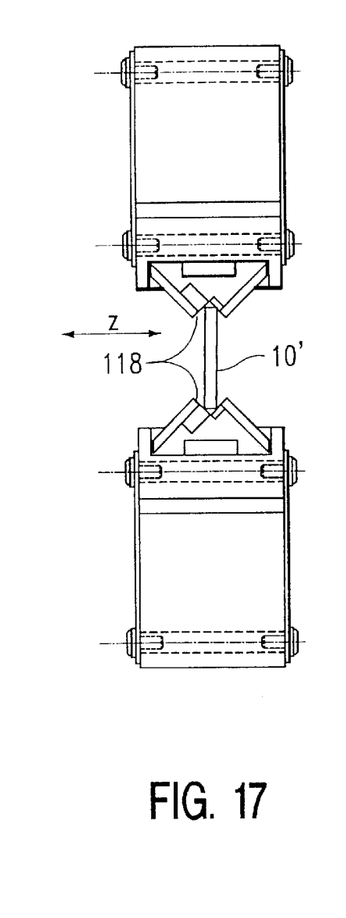
FIG. 17 is a side view of the preferred embodiment of the cutting assembly taken through line 17—17 of FIG. 16.

FIGS. 16 and 17 depict the most preferred embodiment for obtaining the automatic adjustment and alignment of the guide 112 to the substrate 10', shown here as being substantially rectangular. Flexible links 300 pivotally connect the base member 114 and a guide member support 302 via pivot pins 304. Preferably, the links 300 on opposed sides of the base member 114 and support 302 are connected to each other by the pins 304. In an alternative that is not illustrated, the links 300 can be sized so that more, or less, than four links 300 are connected to each of the base 114 and support 302.

The links 300 preferably have a substantially rectangular cross-section when viewed across the short axis so that the links 300 are wider than they are thick. The exact dimensions of the links 300 are preferably selected to enable flexing in one plane, e.g., the z-x plane, yet resist twisting. The links 300 pivot on the pivot pin 304 axis in the x-y plane. The strict z-x flexure, resistance to twisting and x-y pivoting, facilitate maintaining true orthogonality and minimization of rotation between the guide member 112 and the substrate 10' to permit improved alignment therebetween. Rotation that can occur when the rods 120 (FIG. 5) are used is minimized by use of the links 300. The ability of the links 300 to flex and pivot without twisting permits the guide member 112 to "float" and automatically adjust to the substrate edges 12 and minimize or eliminate twisting that can adversely affect alignment.

The links 300 permit the guide member 112 to travel a greater amount (as compared to the rods) without damage to the links 300. The greater travel results in the accommodation of substrates 10' having a great variation in width. The greater variation means that rectangular substrates may now be accommodated, in addition to square substrates.

The resilient tensioning means 122' includes the links 300 and a coil spring 306. The first tensioning force corresponds to a force exerted by the links 300 and coil spring 306 ultimately upon the guide member 112 when the guide surface 118 is not in contact with the substrate 10' to be chamfered. The second tensioning force corresponds to a force exerted by the links 300 and coil spring 306 ultimately upon the guide member 112 when the guide surface 118 is engaged against the substrate 10' during chamfering.

An air cylinder 308 is operably associated with a head 310 that is adjacent to the support 302 and applies force in the y-direction. When air is introduced into the cylinder 308, the head 310 is urged against the support 302 which is thereby pivoted away from the substrate 10' so that the guide member 112 no longer engages the substrate 10'. The pivoting of the support 302 continues until the support 302 engages, and is forced against, a stop 312 which eliminates any play or rattling by the guide member 112 when other functions are in operation. The engagement of the support 302 and stop 312 is the normal at rest position. When air is no longer introduced into the air cylinder 308, a biasing spring 314 urges the head 310 away from the support 302, permitting the support 302 to pivot and the guide member 112 to engage substrate 10'. The coil spring 306 also pushes the guide member 112 into the chamfer engaging position. As the guide member 112 contacts the substrate 10', the head 310 eventually disengages from the guide member 112. A safety 316 limits the travel of the head 310 away from the support 302 so that if the substrate 10' is absent, the head 310 and support 302 continue to be engaged and pivoting ceases before the pedestal 102 (FIG. 3) is undesirably contacted.

As discussed above, in FIG. 5 resilient tensioning means 122 alternatively includes a base member 114 and two sets of parallel resilient rods 120. The two sets of parallel resilient rods 120 are disposed between the base member 114 and the guide member 112. Furthermore, the first tensioning force corresponds to a force exerted by the two sets of parallel resilient rods upon the guide member when the guide surface is not in contact with the workpiece to be chamfered. The second tensioning force corresponds to a force exerted by the two sets of parallel resilient rods upon the guide member when the guide surface is engaged against the workpiece during chamfering. Still yet another tensioning force can be externally applied, corresponding to an external force applied for positioning the guide member in a by-pass position, as will be discussed further herein below in connection with an operation of the chamfering apparatus of the present invention.

Figure 18:
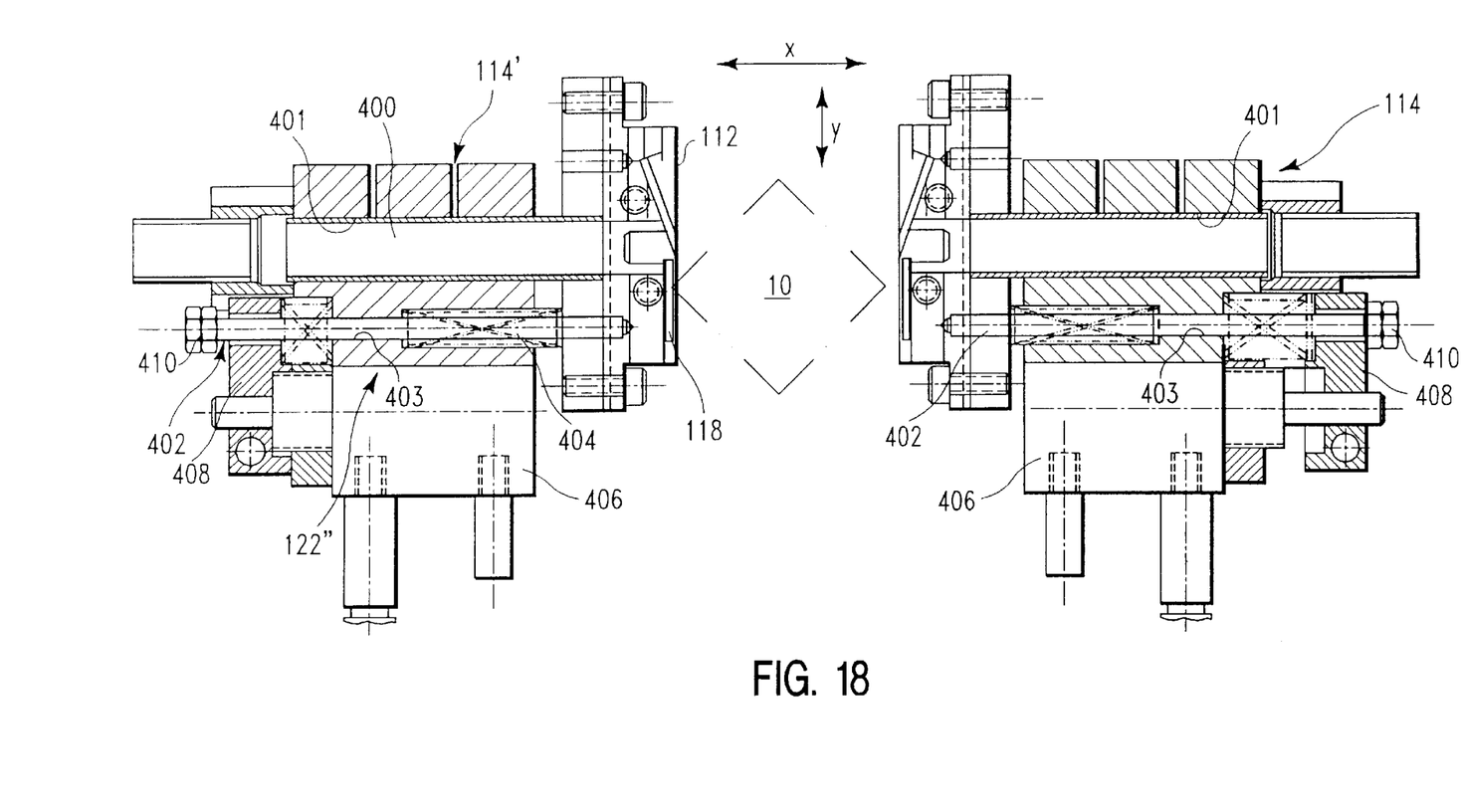
FIG. 18 illustrates a top view of an alternate embodiment in accordance with the present invention for chamfering corner edges of a substrate.

Depicted in FIG. 18 is another embodiment for obtaining the automatic adjustment and alignment of the guide 112 to the substrate 10. Fixedly attached to the guide 112 is piston 400 which is free to travel in the x-direction along a first guide channel 401 defined in base member 114'. Also fixedly attached to guide 112 and in parallel with piston 400, is shaft 402. Shaft 402 is also free to travel in the x-direction, along a second guide channel 403 defined in base member 114'. As shown, substrate 10 is oriented so as to cut a chamfer on its corner.

Suitable engagement of the guide 112 to the substrate 10 is provided by resilient tensioning means 122". Resilient tensioning means 122" includes base member 114' and coil spring 404. The first tensioning force corresponds to a force exerted by the coil spring 404 ultimately upon guide member 112 when the guide surface 118 is not in contact with the substrate 10 to be chamfered. The second tensioning force corresponds to a force exerted by the coil spring 404 ultimately upon guide member 112 when the guide surface 118 is engaged against the substrate 10 during chamfering. The base member 114' is then clamped to secure the piston 400, and hence the guide 112, in place.

An air cylinder 406 is operatively associated with a coupler 408 and stop 410 to apply force to guide member 112 in the x-direction. When air is introduced into the cylinder 406, the coupler 408 is urged against stop 410 thus engaging shaft 402 which in turn pulls guide member 112 in the x-direction away from the substrate 10 so that guide surface 118 no longer engages the substrate 10. In this preferred embodiment, the piston 400 moves in concert with the guide member 112 acting to rigidly hold and maintain the guide member 112 in strict orthogonality with the x-y axis. Alternative structure can be utilized to provide regidity and maintain orthogonality. When air is no longer introduced into air cylinder 406 the coil spring 404 urges the guide 112 into the chamfer engagement position with substrate 10. Obviously, this embodiment can be configured so that air urges the guider member into engagement and the spring retracts the guide member when air is not provided.

In another embodiment that is not illustrated, the guide with the attached piston has a flat guide surface (e.g., FIG. 18) is positioned to chamfer an edge. Obviously, two guides can be used to chamfer two edges.

In an embodiment that is not illustrated, the guide with the attached piston has a V-shaped guide surface (e.g., FIG. 17) and is positioned to chamfer two opposed edges.

Figure 11:
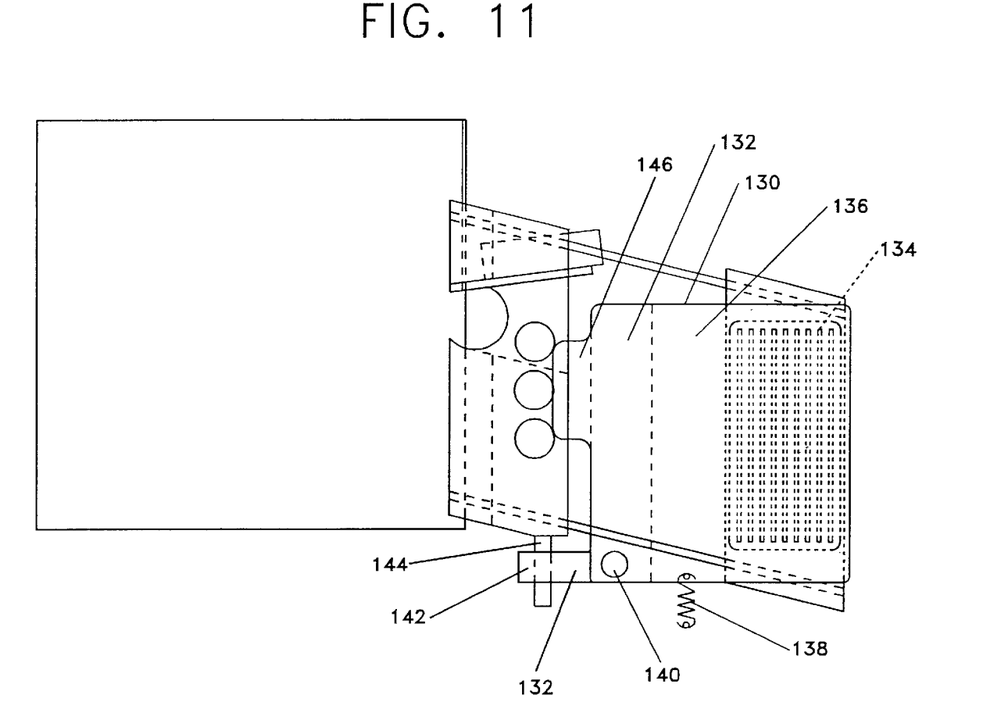
FIG. 11 illustrates a top view of the cutting assembly of the self-aligned chamfering apparatus of the present invention of FIG. 5 shown in further detail.
Figure 12:
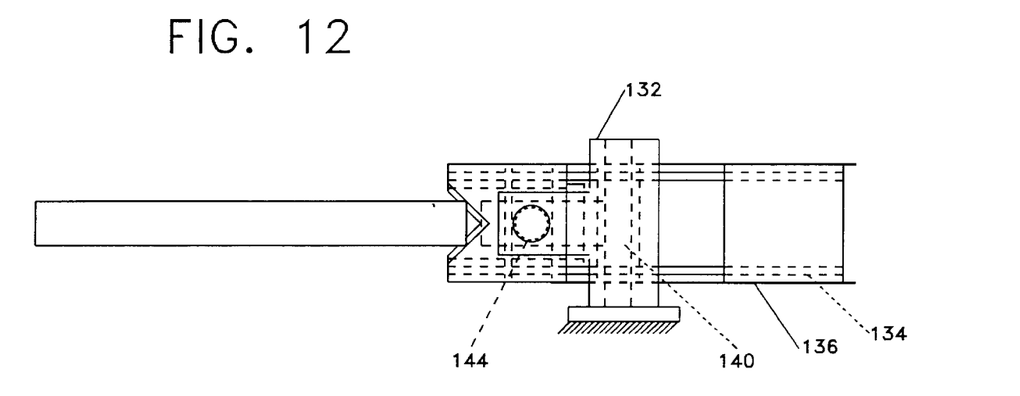
FIG. 12 show a side view of the cutting assembly of the self-aligned chamfering apparatus of FIG. 11.

Turning now to FIGS. 11 and 12, a locking means 130 is used for securing the guide member 112, as appropriate, for maintaining a chamfer engaging position and the desired cutting depth CD subsequent to the guide surface 118 no longer being in contact with the workpiece 10 during a chamfering operation. In a first embodiment, locking means includes a locking member 132 for abutment with the guide member 112. The locking member 132 is disposed for following a positioning of the guide member 112 as guide member 112 is tensioned by the resilient tensioning means 122. To facilitate the following of the positioning of guide member 112, locking member 132 is disposed for pivotal movement about a pivot pin 140. Spring tension is applied to locking member 132 as appropriate via a suitable spring 138 (and/or spring tension) for disposing the abutment end 142 of locking member 132 against an abutment portion of guide member 112, further as shown in FIG. 11. Locking means 130 further includes a membrane 136. Membrane 136 comprises any suitable rigid but flexible material of a suitable weight for its intended purpose, as discussed herein. Locking member 132 further includes an abutment end portion 142 having an adjustable positioning abutment pin 144. Locking means 130 further includes a vacuum chuck 134 disposed in the base member 114 of the resilient tensioning means 122. A portion 136 of the locking member 132 is further disposed across and held in a locked position by the vacuum chuck 134 upon an application of vacuum to the vacuum chuck 134. Vacuum is applied in a controlled manner to the vacuum chuck 134 via an external vacuum source and suitable vacuum hose connections (not shown). When secured by the vacuum chuck 134, the locking member 132 thereby locks the positioning of the guide member 112 at the time of application of vacuum to the vacuum chuck 134. The adjustable abutment pin 144 is used for adjusting a pivotal relationship of the locking member 132 with respect to the guide member 112 such that membrane 136 covers vacuum chuck 134 to thereby ensure an ability to lock the guide member in a particular chamfering guide position. As shown in FIG. 12, a vacuum chuck may be disposed in a top surface and a bottom surface of base member 114 for securing a top portion and a bottom portion, respectively, of locking member 132. Still further, guidance tabs 146 may also be provided in membrane 136, wherein the guidance tabs 146 provide mutual guidance for locking member 132 and guide member 112 in a Z-direction.

Alternatively, locking means 130 may include one or more membranes alone coupled directly to guide member 112, either to a top surface, a bottom surface, or both, wherein the membrane follows a positioning of guide member 112 as tensioned by the resilient tensioning means 122. In this instance, locking means 130 further includes a vacuum chuck 134 disposed in the base member 114 of the resilient tensioning means 122, wherein a portion of the membrane or membranes extends over the vacuum chuck 134. When secured by the vacuum chuck 134, the membrane or membranes thereby lock the positioning of the guide member at the time of application of vacuum to the vacuum chuck.

Figure 13:
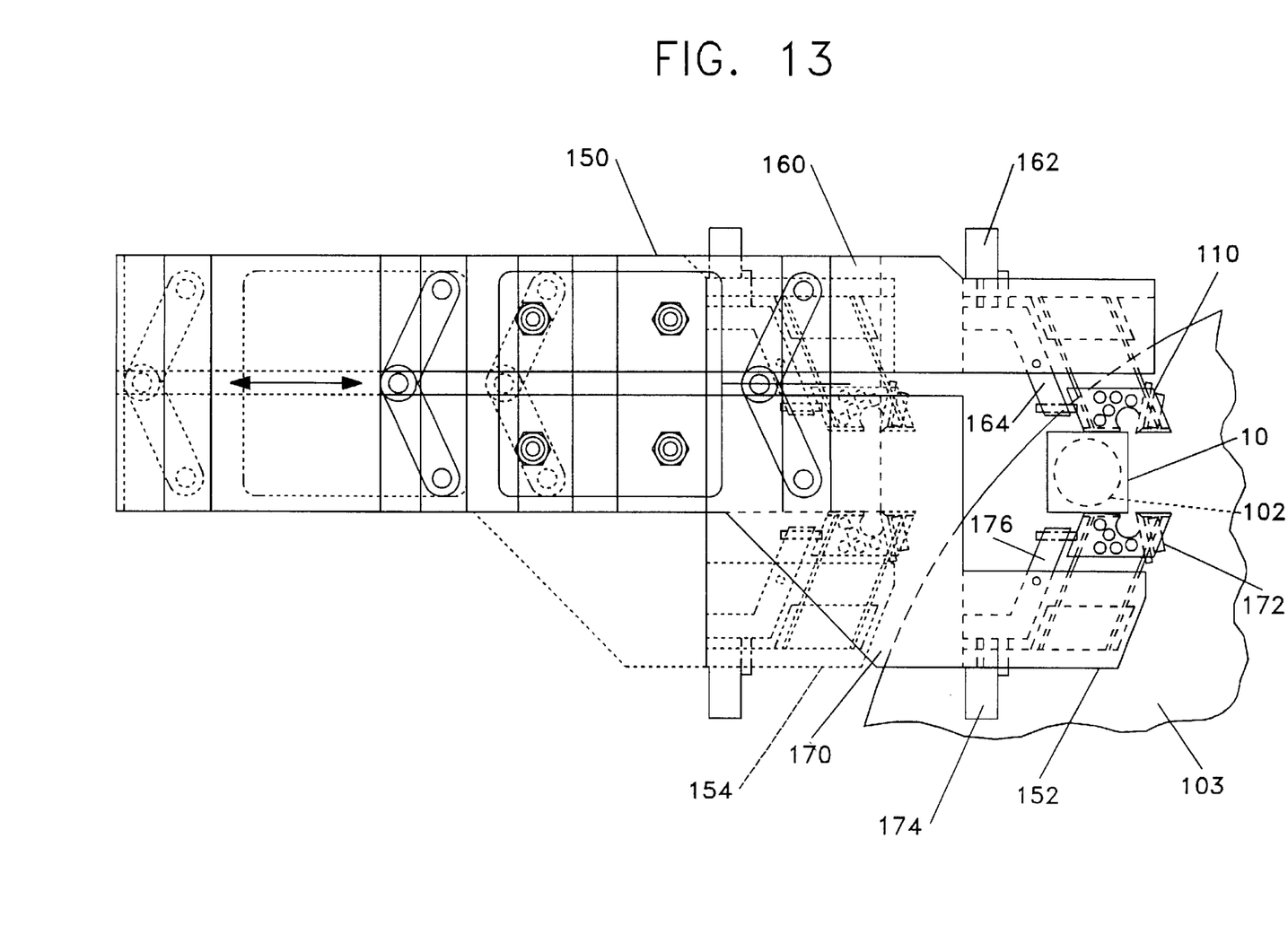
FIG. 13 illustrates a top view of an embodiment of a mechanism for moving the cutting assembly between chamfer start and chamfer end positions in accordance with the present invention.

Referring once again to FIGS. 3 and 4, in addition to FIG. 13, the apparatus 100 for self-aligned chamfering of a workpiece in accordance with the present invention includes suitable means 102 for releasably securing the workpiece in preparation for a chamfering thereof. The substrate securing means 102 may include any form of securing device appropriate for releasably securing the substrate in a desired position and orientation, known in the art. For example, such a securing means 102 may comprise a pedestal upon which the substrate can be received for chamfering. The substrate may be releasably secured to the pedestal via some form of vacuum chuck on a top of the pedestal and/or in combination with a plunger for pressing against a top surface of the substrate for securing the substrate to the pedestal. In addition, the particular method for securing of the substrate may vary depending upon the particular chamfering operation being performed upon the substrate. Furthermore, the pedestal may be mounted upon a turntable 103, wherein numerous pedestals can be used for sequentially chamfering a plurality of substrates in a prescribed order, during a manufacturing process.

The cutting assembly 110 of FIG. 13 are similar to those as described and discussed earlier with respect to FIGS. 5–12. That is, cutting assembly 110 includes a guide member 112 having a guide surface 118. A blade member 116 is mechanically coupled with respect to the guide surface 118 for establishing a desired cutting depth. A resilient tensioning means 122 applies a resilient tensioning force to the guide member 112, wherein the resilient tensioning means applies a first tensioning force when the guide member 112 is in a non-chamfer engaging position. The resilient tensioning means 122 applies a second tensioning force greater than the first tensioning force when the guide member 112 is in a chamfer engaging position, the chamfer engaging position corresponding to a position of the guide member 112 when the guide surface 118 engages the portion of the workpiece 10 to be chamfered. A locking means 130 is used to selectively lock the guide member 112 for maintaining the chamfer engaging position and the desired cutting depth subsequent to the guide surface 118 no longer being in contact with the workpiece 10 during a chamfering operation.

Still referring to FIG. 13, a moving means 150 is provided for moving the cutting assembly 110 proximate the securing means 102 between a chamfer start first position 152 and a chamfer end second position 154 as shown. When moved by the moving means 150, the cutting assembly 110 traverses along an edge portion of the workpiece 10 to be chamfered as the cutting assembly 110 is moved from the chamfer start first position to the chamfer end second position.

In a first embodiment, the moving means 150 includes a linear slide mechanism having an arm assembly 160, wherein the cutting assembly 110 is coupled to the arm assembly 160 in a suitable manner. A chamfer enable means 162 is coupled to the arm assembly 160 for disposing the cutting assembly 110 between a non-chamfer enable position and a chamfer enable position. The chamfer enable means 162 disposes the guide member 112 in a non-chamfer enable position which corresponds to a positioning of the guide member 112 in an out of the way position (i.e., by-pass position). Likewise, when the chamfer enable means 162 disposes the guide member 112 in a chamfer enable position, the same refers to the chamfer enable means 162 allowing the guide member 112 to make contact with the portion of the substrate 10 to be chamfered. That is, the guide member 112 is not restrained by the chamfer enable means 162.

In addition, moving means 150 may also include a linear slide mechanism having a first arm assembly 160 and a second arm assembly 170. In this instance, the self-aligned chamfering apparatus 100 further includes a second cutting assembly 172 similar to the first. The first cutting assembly 110 is coupled to the first arm assembly for chamfering a first side edge of the workpiece 10. The second cutting assembly 172 is coupled to the second arm assembly 170 for chamfering a second side edge of the workpiece, opposite the first side edge. The two opposite sides of the workpiece 10 can thus be chamfered simultaneously. Chamfering of the first side edge and the second side edge can be done in a same direction or in opposite directions. In the latter case, the first arm assembly 160 traverses in a first direction for chamfering of a first side edge of the workpiece in the first direction and the second arm assembly 170 traverses in an opposite direction for chamfering of the opposite side edge of the workpiece in the opposite direction. The moving means 150 may further include chamfer enable means (162 and 174, respectively) coupled to the first and second arm assemblies for disposing the first and second cutting assemblies (110, 172), respectively, between a non-chamfer enable position and a chamfer enable position, similarly as indicated herein above. In a preferred embodiment, chamfer enable means 162 includes a small air cylinder which drives an open/release mechanism 164 which is used to restrain cutter assembly 110 in a prescribed position to provide clearance as the cutter assembly 110 moves from the retracted position 154, past the substrate 10 which is centered on a pedestal 102, to the chamfer start position 152. Once this chamfer start position 152 is reached, the air cylinder 162 is operated to release the cutter assembly 110 and allow the guide member 112 of assembly 110 to close and contact the respective edge 12 of the ceramic substrate 10.

Referring still to FIG. 13, operation of the tool begins with a first and second cutter assembly (110, 172) positioned in a retracted position as shown by phantom lines, with each cutter assembly further restrained in an open state. Small air cylinders (162, 174) drive open/release mechanisms (164, 176) which are used to restrain each of the cutter assemblies (110, 172) in a prescribed position to provide clearance as the cutter assemblies (110, 172) move from the retracted position 154, past the substrate 10 which is centered on a pedestal, to the chamfer start position 152. Once this chamfer start position is reached, the respective air cylinders release the cutter assemblies (110, 172) and allows the guide member 112 of each assembly to close and contact the respective edge 12 of the ceramic substrate 10.

Once the cutter assemblies (110, 172) are aligned by the guides 112 and in a closed state, the cutter assemblies (110, 172) are returned to the retracted position 154. During this movement, the top and bottom edges of two parallel sides of substrate 10 are chamfered. The spring pressure on the respective guide members 112 due to the flexure of the parallel rods 120 ensures that the guides 112 are at all times in contact with the edges of the substrate 10 and that the blades 116 are in a position to remove the desired amount of material. As the guide member 112 nears an end of the substrate 10, a respective locking mechanism 130 (FIGS. 11 and 12) is activated which molds each respective cutter assembly (110, 172) in a fixed position so that the remainder of the chamfer can be made at the same depth even though the guide surface 118 of guide member 112 will no longer be in contact with the edge 12 of the substrate 10.

Figure 14:
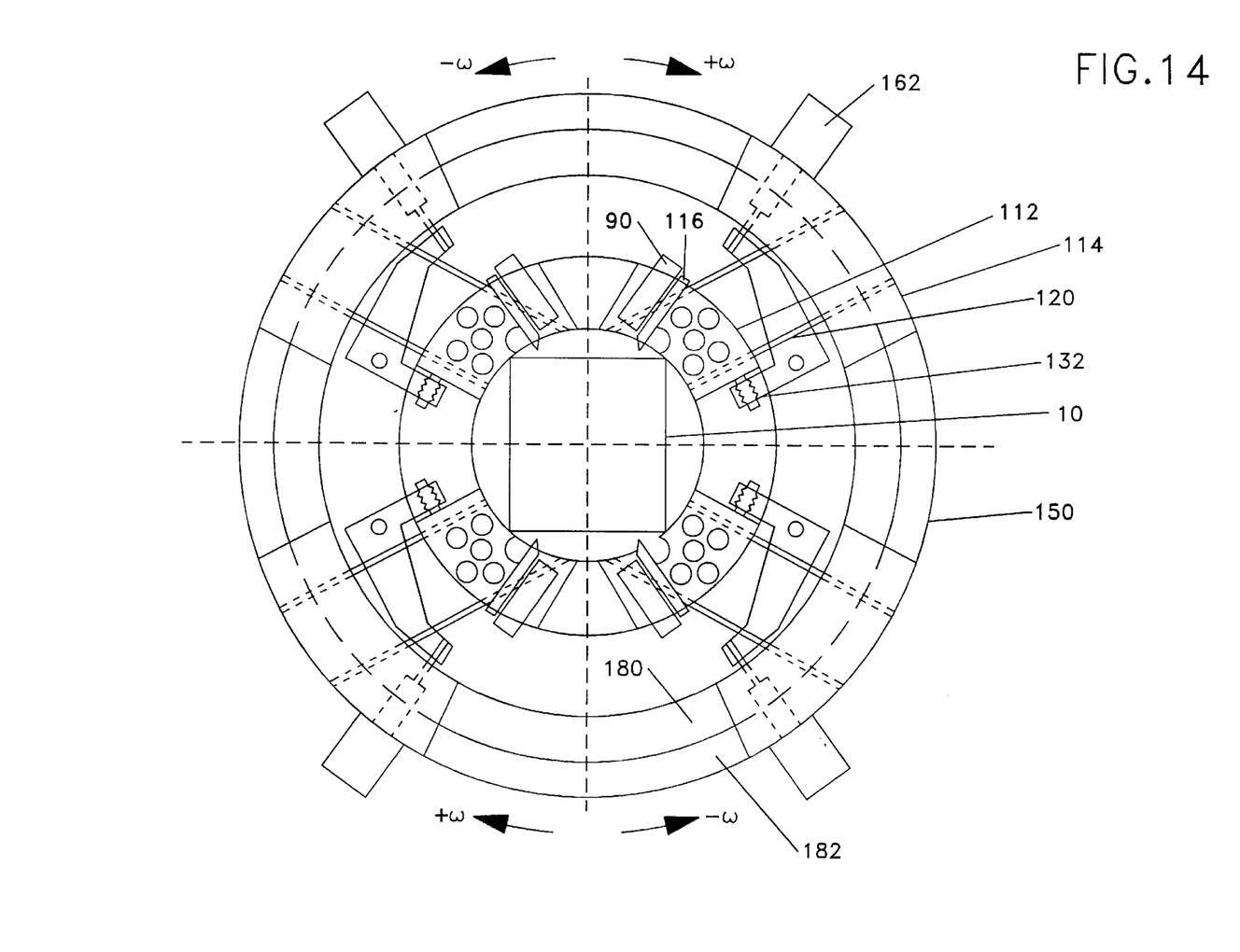
FIG. 14 illustrates a top view of an alternate embodiment in accordance with the present invention for chamfering corner edges of a substrate.

The corners of a substrate 10 can be chamfered using similar cutter assemblies arranged in a radial configuration (See FIG. 14). The cutter assemblies would be released and the respective guides would contact and align to the corner of the substrate. Once the cutter assemblies were aligned, the cutter assemblies would be moved in a radial path, forcing a respective blade through the corresponding corner of the substrate 10, thus creating a corner chamfer. A locking mechanism, similar to that as described earlier with respect to FIGS. 11 and 12 above, is used to keep the cutter assembly in a correct chamfering position when the guide surface loses contact with the substrate corner. In the embodiment as shown in FIG. 14, four cutter assemblies are coupled in such a manner so as to act in opposing pairs to minimize a resultant force on the substrate 10 while also producing a four corner chamfer in one pass.

An alternate embodiment according to the invention, as shown in FIG. 14, includes components as discussed herein above however, moving means 150 is in the form of a rotational slide mechanism having a ring assembly, wherein the cutting assembly is coupled to the ring assembly. Furthermore, a chamfer enable means, similar to that as discussed earlier herein, can be coupled to the ring assembly for disposing the cutting assembly between a non-chamfer enable position and a chamfer enable position. In addition, the moving means may include a rotational slide mechanism having a first ring assembly 180 and a second ring assembly 182, wherein the self-aligned chamfering apparatus further includes a second cutting assembly similar to the first, wherein the first cutting assembly is coupled to the first ring for chamfering a first corner edge of the workpiece and the second cutting assembly is coupled to the second ring assembly for chamfering a second corner edge of the workpiece, opposite the first corner edge, the two opposite corner edges of the workpiece being chamfered simultaneously. Still further, the moving means may also include chamfer enable means, as discussed herein above, coupled to the first and second ring assemblies for disposing said first and second cutting assemblies, respectively, between a non-chamfer enable position and a chamfer enable position. In a first embodiment of rotational chamfering, the first ring assembly may traverse in a first rotational direction +ω for chamfering of a first corner edge of the workpiece in the first rotational direction and the second ring assembly may traverse in an opposite rotational direction −ω for chamfering of the opposite corner edge of the workpiece in the opposite rotational direction, thereby a minimal net force effect upon the substrate being chamfered. Still further, alternatively, the moving means may include a rotational slide mechanism having a first ring assembly and a second ring assembly, wherein the self-aligned chamfering apparatus further includes second, third, and fourth cutting assemblies similar to the first, wherein the first and second cutting assemblies are coupled to the first ring for chamfering a first and a third corner edge, opposite the first corner edge, of the workpiece and the second and fourth cutting assemblies are coupled to the second ring assembly for chamfering a second corner edge, adjacent the first corner edge, and a fourth corner edge, opposite the second corner edge, of the workpiece, the four corner edges of the workpiece being chamfered simultaneously. The moving means may further include chamfer enable means coupled to the first and second ring assemblies for disposing said first, second, third and fourth cutting assemblies, respectively, between a non-chamfer enable position and a chamfer enable position. Still further, the first ring assembly may traverse in a first rotational direction for chamfering of first and third corner edges of the workpiece in the first rotational direction and the second ring assembly may traverse in an opposite rotational direction for chamfering of the adjacent second and fourth corner edges of the workpiece in the opposite rotational direction, thus advantageously minimizing a rotational torque being exerted upon the substrate during a chamfering thereof.

In accordance with the method for self-aligned chamfering of a workpiece of the present invention, the method includes the steps of releasably securing the workpiece in preparation for a chamfering thereof. A cutting assembly is provided, the cutting assembly including (i) a guide member having a guide surface; (ii) a blade member, the blade member mechanically coupled with respect to the guide surface for establishing a desired cutting depth; (iii) means for applying a resilient tensioning force to the guide member, the resilient tensioning means applying a first tensioning force when the guide member is in a non-chamfer engaging position and applying a second tensioning force greater than the first tensioning force when the guide member is in a chamfer engaging position, the chamfer engaging position corresponding to a position of the guide member when the guide surface engages the portion of the workpiece to be chamfered; and (iv) means for [selectively] locking the guide member to maintain the chamfer engaging position and the desired cutting depth subsequent to the guide surface no longer being in contact with the workpiece. Lastly, the step of moving the cutting assembly proximate the secured workpiece between a chamfer start (first) position and a chamfer end (second) position, wherein the cutting assembly traverses along an edge portion of the workpiece to be chamfered as the cutting assembly is moved from the chamfer start position to the chamfer end position. The method further includes using a guide member, wherein the guide member includes a V-shaped guide surface for slidable engagement along two parallel side edges of the workpiece to be chamfered; and a corresponding blade member which includes blade edges for matching the V-shaped guide surface, each blade edge providing an edge chamfer along a respective side edge of the workpiece. Alternatively, the method includes using a guide member, wherein the guide member includes a flat guide surface for slidable engagement along a corner of the workpiece to be chamfered; and a corresponding the blade member which includes a blade edge for matching the flat guide surface, the blade edge providing a corner chamfer along the corner of the workpiece.

Figure 15:
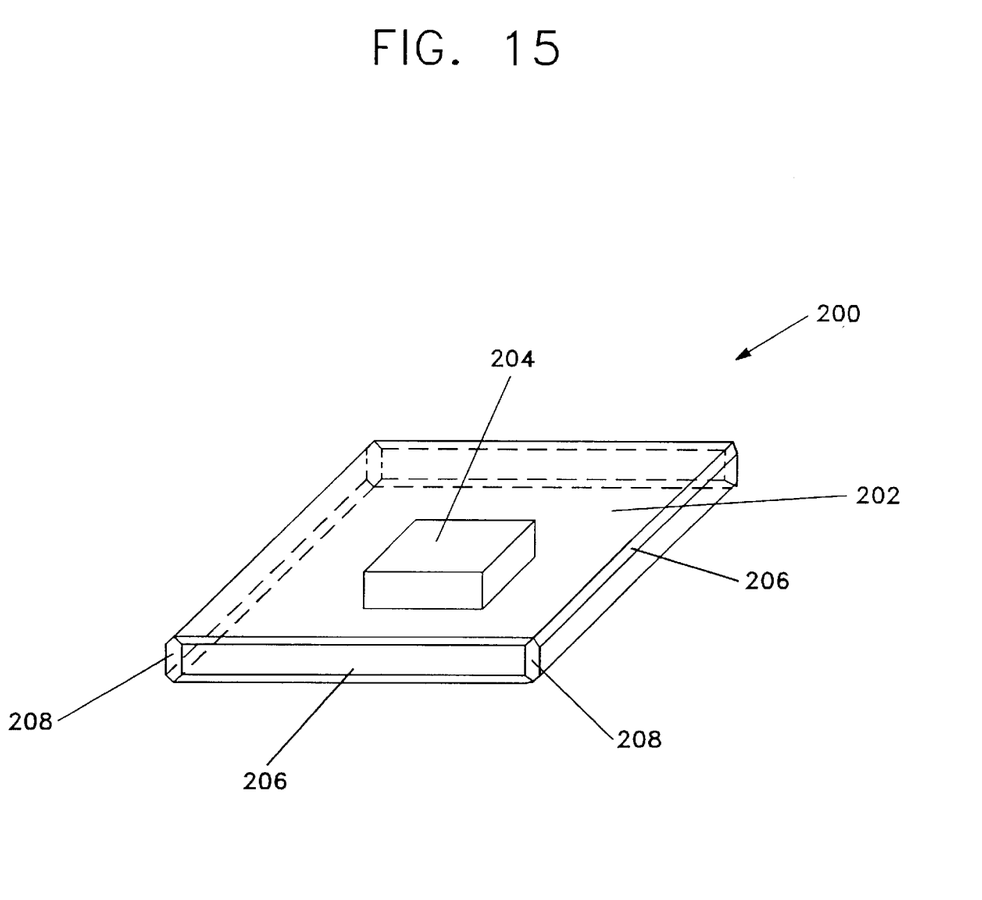
FIG. 15 illustrates a plan view of a module having a semiconductor die mounted upon a substrate chamfered using the apparatus and method of the present invention.

FIG. 15 illustrates a module 200 having a semiconductor die 202 mounted upon a top surface of substrate 204. Substrate 204 includes a substrate chamfered using the chamfer method and apparatus according to the present invention. Substrate 204 includes side edge chamfers 206 and corner chamfers 208. Module 200 further includes suitable electrical connections as known in the art for a next level of packaging (not shown).

The method and apparatus of the present invention thus provide for precise self-aligned chamfering of a minute workpiece, including side edge and corner edge chamfering. Precisely prepared and predictable chamfers are also obtained, regardless of variations in sizes in the X-Y dimension and the Z-dimension of a single workpiece or of multiple workpieces of a particular chamfering operation.

While the invention has been particularly shown and described with reference to specific embodiments thereof, it will be understood by those skilled in the art that various changes in form and detail may be made thereto, and that other embodiments of the present invention beyond embodiments specifically described herein may be made or practiced without departing from the spirit and scope of the invention as claimed. For instance, apparatus according to the present invention may include a moving means having a mechanism which operates upon an oscillatory path, instead of a linear or rotational path, and wherein the chamfer enable means may not then be necessary.

What is claimed is:

1. A cutter apparatus for use in self-aligned chamfering of a workpiece as said cutter apparatus is traversed along a portion of the workpiece to be chamfered, said cutter apparatus comprising:

a guide member having a guide surface;

a blade member mechanically coupled with respect to the guide surface for establishing a desired cutting depth;

means for applying a resilient tensioning force to the guide member, the resilient tensioning means applying a first tensioning force when the guide member is in a non-chamfer engaging position and applying a second tensioning force when the guide member is in a chamfer engaging position, the chamfer engaging position corresponding to a position of the guide member when the guide surface engages the portion of the workpiece to be chamfered; and means for locking the guide member to maintain the chamfer engaging position and the desired cutting depth subsequent to the guide surface no longer being in contact with the workpiece.

2. The cutter apparatus of claim 1, wherein said guide member includes a V-shaped guide surface for slidable engagement along two parallel side edges of the workpiece to be chamfered;

said blade member includes blade edges for matching the V-shaped guide surface, each blade edge providing an edge chamfer along a respective side edge of the workpiece.

3. The cutter apparatus of claim 1, wherein said guide member includes a flat guide surface for slidable engagement along a corner of the workpiece to be chamfered;

said blade member includes a blade edge for matching the flat guide surface, the blade edge providing a corner chamfer along the corner of the workpiece.

4. The cutter apparatus of claim 1, wherein said resilient tensioning means includes a base member and two sets of parallel resilient rods, wherein the two sets of parallel resilient rods are disposed between the base member and said guide member, further wherein the first tensioning force corresponds to a force exerted by the two sets of parallel resilient rods upon said guide member when the guide surface is not in contact with the workpiece to be chamfered and the second tensioning force corresponds to a force exerted by the two sets of parallel resilient rods upon said guide member when the guide surface is engaged against the workpiece during chamfering.

5. The cutter apparatus of claim 4, further wherein said locking means includes a locking member for abutment with said guide member and disposed for following a positioning of said guide member as tensioned by said resilient tensioning means, said locking means further includes a vacuum chuck disposed in the base member of said resilient tensioning means, wherein a portion of the locking member is disposed across and held in a locked position by the vacuum chuck upon an application of vacuum to the vacuum chuck, the locking member thereby locking the positioning of said guide member.

6. The cutter apparatus of claim 4, further wherein said locking means includes a membrane coupled to said guide member, the membrane following a positioning of said guide member as tensioned by said resilient tensioning means, said locking means further includes a vacuum chuck disposed in the base member of said resilient tensioning means, wherein a portion of the membrane extends over the vacuum chuck and further is held in a locked position by the vacuum chuck upon an application of vacuum to the vacuum chuck, the membrane thereby locking the positioning of said guide member.

7. An apparatus for self-aligned chamfering of a workpiece, said apparatus comprising:

means for releasably securing the workpiece in preparation for a chamfering thereof;

a cutting assembly including (i) a guide member having a guide surface; (ii) a blade member, the blade member mechanically coupled with respect to the guide surface for establishing a desired cutting depth; (iii) means for applying a resilient tensioning force to the guide member, the resilient tensioning means applying a first tensioning force when the guide member is in a non-chamfer engaging position and applying a second tensioning force when the guide member is in a chamfer engaging position, the chamfer engaging position corresponding to a position of the guide member when the guide surface engages the portion of the workpiece to be chamfered; and (iv) means for locking the guide member to maintain the chamfer engaging position and the desired cutting depth subsequent to the guide surface no longer being in contact with the workpiece; and means for moving said cutting assembly proximate said securing means between a first position and a second position, wherein said cutting assembly traverses along an edge portion of the workpiece to be chamfered as said cutting assembly is moved from the first position to the second position.

8. The self-aligned chamfering apparatus of claim 7, wherein the guide member includes a V-shaped guide surface for slidable engagement along two parallel side edges of the workpiece to be chamfered; and the blade member includes blade edges for matching the V-shaped guide surface, each blade edge providing an edge chamfer along a respective side edge of the workpiece.

9. The self-aligned chamfering apparatus of claim 7, wherein the guide member includes a flat guide surface for slidable engagement along a corner of the workpiece to be chamfered; and the blade member includes a blade edge for matching the flat guide surface, the blade edge providing a corner chamfer along the corner of the workpiece.

10. The self-aligned chamfering apparatus of claim 7, wherein the resilient tensioning means includes a base member and two sets of parallel resilient rods, wherein the two sets of parallel resilient rods are disposed between the base member and the guide member, further wherein the first tensioning force corresponds to a force exerted by the two sets of parallel resilient rods upon the guide member when the guide surface is not in contact with the workpiece to be chamfered and the second tensioning force corresponds to a force exerted by the two sets of parallel resilient rods upon the guide member when the guide surface is engaged against the workpiece during chamfering.

11. The self-aligned chamfering apparatus of claim 10, further wherein the locking means includes a locking member for abutment with the guide member and disposed for following a positioning of the guide member as tensioned by the resilient tensioning means, the locking means further includes a vacuum chuck disposed in the base member of the resilient tensioning means, wherein a portion of the locking member is disposed across and held in a locked position by the vacuum chuck upon an application of a vacuum source to the vacuum chuck, the locking member thereby locking the positioning of the guide member.

12. The self-aligned chamfering apparatus of claim 10, further wherein the locking means includes a membrane coupled to the guide member, the membrane following a positioning of said guide member as tensioned by the resilient tensioning means, the locking means further includes a vacuum chuck disposed in the base member of the resilient tensioning means, wherein a portion of the membrane extends over the vacuum chuck and further is held in a locked position by the vacuum chuck upon an application of a vacuum source to the vacuum chuck, the membrane thereby locking the positioning of the guide member.

13. The self-aligned chamfering apparatus of claim 7, wherein said moving means includes a linear slide mechanism having an arm assembly, wherein said cutting assembly is coupled to the arm assembly, and a chamfer enable means coupled to the arm assembly for disposing said cutting assembly between a non-chamfer enable position and a chamfer enable position.

14. The self-aligned chamfering apparatus of claim 7, wherein said moving means includes a linear slide mechanism having a first arm assembly and a second arm assembly, said self-aligned chamfering apparatus further comprising:

a second cutting assembly similar to the first, wherein the first cutting assembly is coupled to the first arm assembly for chamfering a first side edge of the workpiece and the second cutting assembly is coupled to the second arm assembly for chamfering a second side edge of the workpiece, opposite the first side edge, the two opposite sides of the workpiece being chamfered simultaneously.

15. The self-aligned chamfering apparatus of claim 14, wherein said moving means further includes chamfer enable means coupled to the first and second arm assemblies whereby said first and second cutting assemblies, respectively, are between a non-chamfer enable position and a chamfer enable position.

16. The self-aligned chamfering apparatus of claim 14, wherein the first arm assembly traverses in a first direction for chamfering of a first side edge of the workpiece in the first direction and the second arm assembly traverses in an opposite direction for chamfering of the opposite side edge of the workpiece in the opposite direction.

17. The self-aligned chamfering apparatus of claim 7, wherein said moving means includes a rotational slide mechanism having a first ring assembly and a second ring assembly, said self-aligned chamfering apparatus further comprising:

a second cutting assembly similar to the first, wherein the first cutting assembly is coupled to the first ring for chamfering a first corner edge of the workpiece and the second cutting assembly is coupled to the second ring assembly for chamfering a second corner edge of the workpiece, opposite the first corner edge, the two opposite corner edges of the workpiece being chamfered simultaneously.

18. The self-aligned chamfering apparatus of claim 17, wherein said moving means further includes chamfer enable means coupled to the first and second ring assemblies for disposing said first and second cutting assemblies, respectively, between a non-chamfer enable position and a chamfer enable position.

19. The self-aligned chamfering apparatus of claim 17, wherein the first ring assembly traverses in a first rotational direction for chamfering of a first corner edge of the workpiece in the first rotational direction and the second ring assembly traverses in an opposite rotational direction for chamfering of the opposite corner edge of the workpiece in the opposite rotational direction.

20. The self-aligned chamfering apparatus of claim 7, wherein said moving means includes a rotational slide mechanism having a first ring assembly and a second ring assembly, said self-aligned chamfering apparatus further comprising:

second, third, and fourth cutting assemblies similar to the first, wherein the first and second cutting assemblies are coupled to the first ring for chamfering a first and a third corner edge, opposite the first corner edge, of the workpiece and the second and fourth cutting assemblies are coupled to the second ring assembly for chamfering a second corner edge, adjacent the first corner edge, and a fourth corner edge, opposite the second corner edge, of the workpiece, the four corner edges of the workpiece being chamfered simultaneously.

21. The self-aligned chamfering apparatus of claim 20, wherein said moving means further includes chamfer enable means coupled to the first and second ring assemblies for disposing said first, second, third and fourth cutting assemblies, respectively, between a non-chamfer enable position and a chamfer enable position.

22. The self-aligned chamfering apparatus of claim 20, wherein the first ring assembly traverses in a first rotational direction for chamfering of first and third corner edges of the workpiece in the first rotational direction and the second ring assembly traverses in an opposite rotational direction for chamfering of the adjacent second and fourth corner edges of the workpiece in the opposite rotational direction.

23. A method for self-aligned chamfering of a workpiece, said method comprising the steps of:

releasably securing the workpiece in preparation for a chamfering thereof;

providing a cutting assembly including (i) a guide member having a guide surface; (ii) a blade member, the blade member mechanically coupled with respect to the guide surface for establishing a desired cutting depth; (iii) means for applying a resilient tensioning force to the guide member, the resilient tensioning means applying a first tensioning force when the guide member is in a non-chamfer engaging position and applying a second tensioning force when the guide member is in a chamfer engaging position, the chamfer engaging position corresponding to a position of the guide member when the guide surface engages the portion of the workpiece to be chamfered; and (iv) means for locking the guide member to maintain the chamfer engaging position and the desired cutting depth subsequent to the guide surface no longer being in contact with the workpiece; and moving the cutting assembly proximate the secured workpiece between a first position and a second position, wherein the cutting assembly traverses along an edge portion of the workpiece to be chamfered as the cutting assembly is moved from the first position to the second position.

24. The self-aligned chamfering method of claim 23, wherein the guide member includes a V-shaped guide surface for slidable engagement along two parallel side edges of the workpiece to be chamfered; and the blade member includes blade edges for matching the V-shaped guide surface, each blade edge providing an edge chamfer along a respective side edge of the workpiece.

25. The self-aligned chamfering method of claim 23, wherein the guide member includes a flat guide surface for slidable engagement along a corner of the workpiece to be chamfered; and the blade member includes a blade edge for matching the flat guide surface, the blade edge providing a corner chamfer along the corner of the workpiece.

* * * * *